United States Patent
Shaw et al.

(10) Patent No.: US 9,371,222 B2
(45) Date of Patent: Jun. 21, 2016

(54) MICROSTRUCTURE PLATING SYSTEMS AND METHODS

(71) Applicant: Honeywell International Inc., Morristown, NJ (US)

(72) Inventors: Gordon A. Shaw, Plymouth, MN (US); Daniel Baseman, Minneapolis, MN (US); Chris Finn, Maple Lake, MN (US); Jim G. Hunter, Robbinsdale, MN (US)

(73) Assignee: Honeywell International Inc., Morristown, NJ (US)

( * ) Notice: Subject to any disclaimer, the term of this patent is extended or adjusted under 35 U.S.C. 154(b) by 481 days.

(21) Appl. No.: 13/839,923

(22) Filed: Mar. 15, 2013

(65) Prior Publication Data
US 2014/0260710 A1    Sep. 18, 2014

(51) Int. Cl.
*G01D 11/00* (2006.01)
*B81C 1/00* (2006.01)

(52) U.S. Cl.
CPC ....... *B81C 1/0015* (2013.01); *B81B 2201/0292* (2013.01); *B81C 2201/0197* (2013.01)

(58) Field of Classification Search
CPC .. B81C 1/00341; B81C 1/00373; B81C 1/00; B81C 1/0015; B81C 2201/0292; B81C 2201/0197; G01D 11/00; B81B 2201/0292

USPC ............. 73/866.5; 427/125, 58; 228/176
See application file for complete search history.

(56) References Cited

U.S. PATENT DOCUMENTS

| | | | | |
|---|---|---|---|---|
| 2001/0014409 A1* | 8/2001 | Cohen | ............... | B81C 1/00126 428/606 |
| 2006/0269761 A1* | 11/2006 | Aiba | ............... | C23C 18/1651 428/457 |
| 2012/0326297 A1* | 12/2012 | Choi | ............... | H01L 23/3171 257/737 |

OTHER PUBLICATIONS

Paul A. Kohl. "Electrodeposition of Gold". Modern Electroplating, Fifth Edition Edited by Mordechay Schlesinger and Milan Paunovic. 2010. John Wiley & Sons, Inc. pp. 115-130.

* cited by examiner

*Primary Examiner* — Selim Ahmed
(74) *Attorney, Agent, or Firm* — Brooks, Cameron & Huebsch, PLLC

(57) ABSTRACT

Microstructure plating systems and methods are described herein. One method includes depositing a plating-resistant material between a microstructure and a bonding layer, wherein the microstructure comprises a plating process base material and immersing the microstructure in a plating solution.

11 Claims, 3 Drawing Sheets

MICROSTRUCTURE PLATING SYSTEMS AND METHODS

GOVERNMENT RIGHTS

This invention was made with Government support. The Government has certain rights in the invention.

TECHNICAL FIELD

The present disclosure relates to microstructure plating systems and methods.

BACKGROUND

Multi-layered gold (Au) beam structures can be desirable for a number of functions in micro-electronic mechanical systems (MEMS). Micro machining some metals such as gold into microstructures capable of function within MEMS can be expensive, tedious, and/or have limited scalability of mass production.

DETAILED DESCRIPTION

Microstructures can be generated by various methods utilizing plating process base materials (e.g., aluminum, copper, silicon, etc.). The microstructures can be multi-layer and cantilevered beam structures. The microstructures can be connected to circuitry (e.g., electronic devices, computing devices, etc.) and be utilized as a sensor. The microstructures receive information via a particular structure and can send signals to the circuitry based on the received information.

The generating of microstructures connected to circuitry can include a predetermined thermal-budget for generation. For example, exceeding the thermal budget can cause damage (e.g., melt, destroy structure, etc.) to desired properties of the microstructure and/or the connected circuitry. The predetermined thermal-budget can include a temperature threshold (e.g., particular temperature that can cause damage). In addition, the predetermined thermal budget can include a time-temperature exposure budget (e.g., a length of time at a particular temperature before causing damage). That is, the thermal-budget can be a maximum temperature threshold to avoid in order to avoid damage to materials. The thermal-budget can also include an amount of time at a particular temperature to expose particular materials before it is likely that the materials would be damaged.

Microstructure plating systems and methods as described herein can be used to generate plated microstructures that are connected to circuitry without exceeding a predetermined thermal-budget. In addition, microstructure plating systems and methods as described herein can be used to generate complex multilayered and cantilevered gold beam structures that can be connected to various circuitry devices.

In the following detailed description, reference is made to the accompanying drawings that form a part hereof. The drawings show by way of illustration how one or more embodiments of the disclosure may be practiced.

These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

As used herein, "a" or "a number of" something can refer to one or more such things. For example, "a number of plating process base materials" can refer to one or more plating process base materials.

Figure 1:
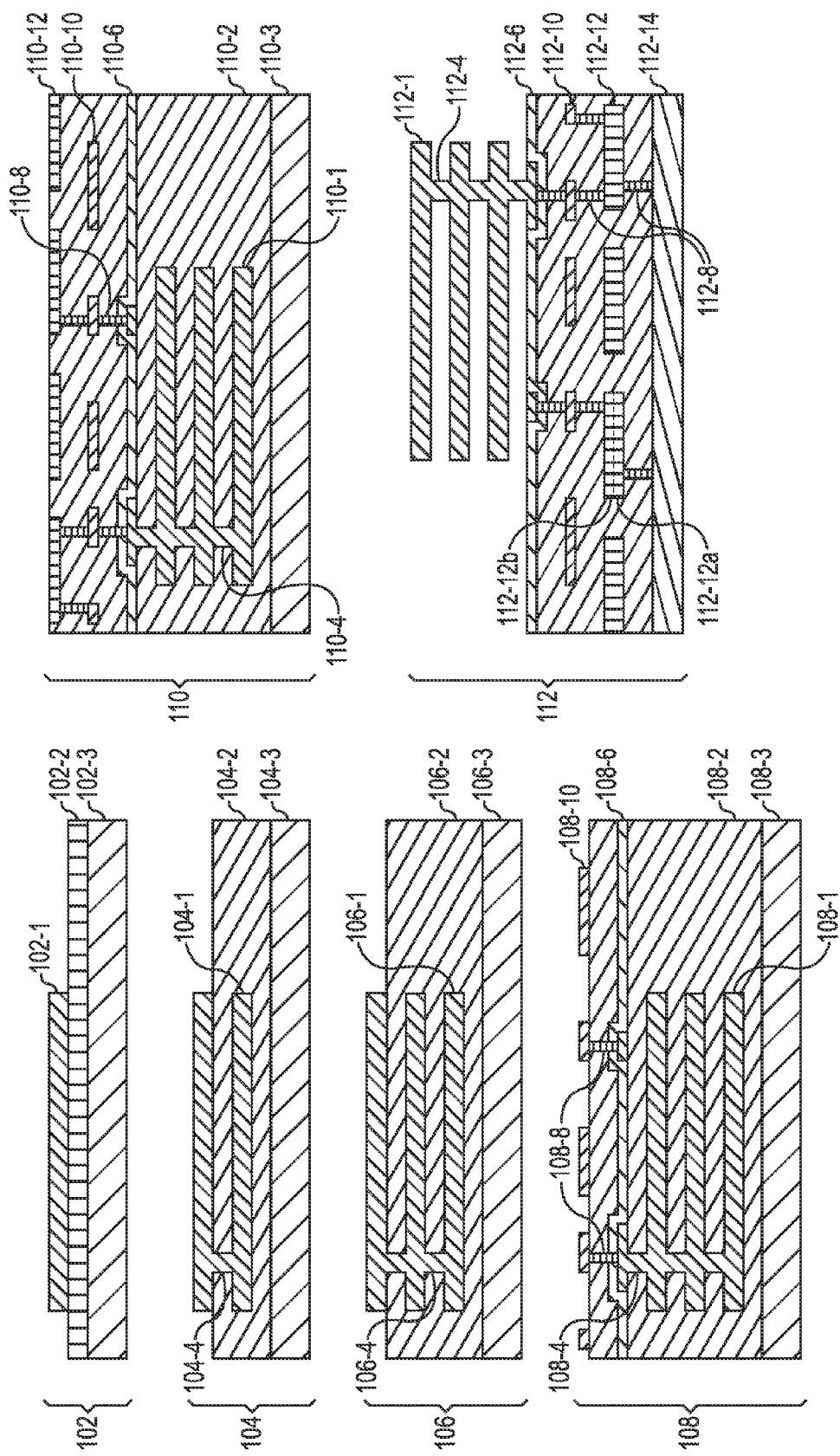
FIG. 1 illustrates an example of a microstructure plating process in accordance with one or more embodiments of the present disclosure.

FIG. 1 illustrates an example of a microstructure plating process 100 in accordance with one or more embodiments of the present disclosure. The plating process can begin by creating a microstructure with a plating process base material and connecting the microstructure to circuitry. Resultant microstructures can be inserted into plating solutions to yield various desired plating material surfaces.

Process 100 can start at step 102. Step 102 provides a mechanical support layer 102-3 (e.g., a silicon wafer, silicon substrate, etc.) to enable the processing of the microstructure. Step 102 can include depositing a dielectric material 102-2 (e.g., silicon oxide ($SiO_2$), etc.). In addition, step 102 can include depositing a plating process base material 102-1 (e.g., silicon, aluminum, copper, platinum, tungsten, silver, titanium nitride (TiN), tantalum nitride (TaN), carbon, etc.) on the dielectric material 102-2.

Process 100 can include step 104. Step 104 can include the same and/or similar elements from step 102. For example, step 104 can include: a deposited mechanical support layer 104-3, a deposited dielectric material 104-2, among other features. At step 104 dielectric material 104-2 can be deposited on the deposited plating process base material from step 102. Step 104 can include etching a via at 104-4. The via 104-4 can be created via a selective etch process that can include dry etching and/or wet etching (e.g., hydrofluoric acid chemical etch, etc.). The via 104-4 can be filled with the plating process base material to create a pillar. The pillar and deposited dielectric material 104-2 can have a chemical mechanical planarization (CMP) process performed to provide a suitable contact surface for depositing additional plating process base material 104-1.

Process 100 can include step 106 that can follow a similar and/or the same process as step 104 for depositing additional plating process base material 106-1. Step 106 can include the same and/or similar elements from steps 102 and 104. For example, step 106 can include: a deposited mechanical support layer 106-3, a deposited dielectric material 106-2, deposited plating process base material 106-1, among other features.

Process 100 can include step 108. Step 108 can include the same and/or similar elements from steps 102 through 106. For example, step 108 can include: a deposited mechanical support layer 108-3, a deposited dielectric material 108-2, deposited plating process base material 108-1, among other features.

Step 108 can include depositing a non-plating process base material 108-6 (e.g., silicon nitride ($Si_3N_4$), etc.) The non-plating process base material 108-6 can be an etch stop material (e.g., material that is not removed by an etching process, etc.). The non-plating process base material 108-6 can act as a barrier (e.g., protective layer, separation between material to be plated and material not to be plated, etc.) between the microstructure and a bonding layer that can be bonded to circuitry.

The bonding layer can include a number of vias 108-8 that can be filled with a conductive material (e.g., Tungston (W), copper plated, aluminum metallization, etc.). The conductive material within the number of vias 108-8 can be the same and/or similar materials to the plating process base material deposited to create the microstructure. The number of vias 108-8 can be coupled to a number of features 108-10 (e.g., interconnects, inductors, capacitors, etc.). The number of features 108-10 can be based on a functionality of the circuitry and/or microstructure.

Process 100 can include step 110. Step 110 can include the same and/or similar elements from steps 102 through 108. For example, step 110 can include: a deposited mechanical support layer 110-3, a deposited dielectric material 110-2, deposited plating process base material 110-1, a number of vias 110-8, among other features. Step 110 can connect the number of features 110-10 coupled in step 108 to a number of bonding wafers 110-12 (e.g., bonding elements, wafer-to-wafer bonding, wafer-to-die bonding, etc.). The number of bonding wafers 110-12 can include bonding materials (e.g., copper, gold, aluminum, etc.) that when placed in contact with another bonding wafer at a predefined temperature (e.g., 400 degrees Celsius, etc.) can bond to a single wafer. There are also other wafer bonding techniques that can be practiced. For example, an oxide-oxide wafer bonding technique can be utilized. The number of bonding wafers 110-12 can be used to connect (e.g., connect via an electrical connection, etc.) the microstructure and a number of features 110-10 to circuitry.

Process 100 can include step 112. Step 112 can include the same and/or similar elements from steps 102 through 110. For example, step 110 can include: a deposited mechanical support layer 112-3, a deposited dielectric material 112-2, deposited plating process base material 112-1, a number of vias 112-8, a number of features 112-10, a number of bonding wafers 112-12, among other features. Step 112 can include bonding the number of wafers 112-12b from step 110 with a number of wafers 112-12a connected to circuitry 112-14 via a number of vias 112-8. The number of vias can include similar conductive material as described herein. Step 112 can also include releasing the microstructure from the dielectric material. Releasing the microstructure from the dielectric material can include utilizing an etching material (e.g., hydrofluoric acid etching solution, etc.) to remove the dielectric material. The non-plating process base material 112-6 can also be an etch stop material to prevent the etching material to remove dielectric material within the bonding layer (e.g., layer comprising number of features 112-10, bonding wafer 112-12, circuitry 112-14, etc.).

Once the microstructure is released from the dielectric material a plating solution can be immersed over the microstructure to plate the microstructure with a plating material (e.g., gold, silver, etc.). The plating solution can be used to deposit the plating material (e.g., gold, silver, etc.) on the plating process base material of the microstructure. For example, the microstructure can be immersed in a gold plating solution (e.g., gold (III) chloride, etc.) to deposit a layer of gold on the microstructure. The gold plating solution can be specific to the plating process base material used to create the microstructure. For example, if the plating process base material is a silicon material, aluminum material, or a copper material with a nickel strike, the plating solution can be specific for plating gold in an isotropic process (e.g., depositing an even layer of material, depositing a layer that is similar and/or identical in all directions, etc.).

The non-plating process base material 112-6 can prevent plating within the bonding layer. The non-plating process base material 112-6 can act as a barrier similarly to the barrier created for the etching material. That is, the non-plating process base material 112-6 can prevent plating of the features within the bonding layer (e.g., features 112-10, bonding wafers 112-12, circuitry 112-14, etc.).

Figure 2:
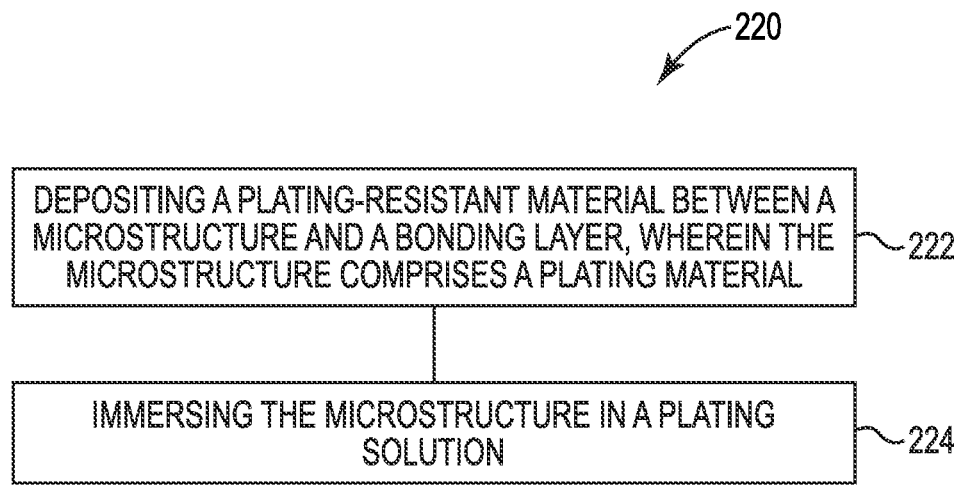
FIG. 2 illustrates an example method for a microstructure plating process in accordance with one or more embodiments of the present disclosure.

FIG. 2 illustrates an example method 220 for a microstructure plating process in accordance with one or more embodiments of the present disclosure. The method 220 can be used to create a microstructure of a material such as gold or silver within a predefined temperature budget. The predefined temperature budget can be defined based on connected circuitry with the microstructure. The connected circuitry and/or microstructure can be damaged if a temperature budget is exceeded.

At box 222 the method 220 can include depositing a plating-resistant material between a microstructure and a bonding layer, wherein the microstructure comprises a plating process base material. Depositing the plating-resistant material between the microstructure and the bonding layer can include depositing an etch stop material that is also a plating-resistant material. For example, the plating resistant material can be a silicon nitride ($Si_3N_4$) deposit. In this example, the silicon nitride deposit can be deposited between the microstructure and the bonding layer to act as an etch stop when releasing the microstructure and to act as a non-plating process base material to protect the bonding layer from plating properties of the plating solution. That is, the plating-resistant material can act as a barrier to protect the bonding layer from being plated with a material (e.g., metal, gold, silver, etc.) while the microstructure is immersed in the plating solution. The plating solution can deposit an isotropic layer on the microstructure.

The microstructure can comprise a plating process base material. The plating process base material can include silicon, aluminum, copper, platinum, tungsten, silver, titanium nitride (TiN), tantalum nitride (TaN), and/or carbon, among various other conductive materials and/or combinations thereof. The microstructure can be formed by depositing a number of layers of plating process base material and connecting the layers by filing a number of etched vias with plating process base material to connect the number of layers. The formation of the microstructure can depend on a type and/or proposed function of the microstructure. For example, a plating process base material can be deposited on a dielectric material, (e.g., silicon dioxide, silicon nitride, etc.). In this example, the dielectric material can be deposited on the plating process base material. A number of vias can be etched in the dielectric material. The number of vias can be filled with the plating process base material and the plating process base material can be deposited on the dielectric material. This example can produce a multi-layer and/or cantilevered beam microstructure.

At box 224 the method 220 can include immersing the microstructure in a plating solution. Immersing the microstructure in the plating solution can include immersing the microstructure in a plating solution that corresponds to the plating process base material of the microstructure. For example, the microstructure can comprise copper. In this example, the plating solution can be a plating solution specifically for plating copper. The plating solution can include a electrodeposition gold plating solution that can deposit a layer of gold on the microstructure. In some cases, a serial step of plating a nickel strike layer on the plating process base material can be performed prior to the electrodeposition gold plating.

The plating solution can include an isotropic plating solution that can plate the plating process base material of the microstructure and retain fine features (e.g., structural features, features for functionality, etc.) of the microstructure. For example, the plating solution can deposit a uniform layer of a material (e.g., gold, silver, etc.) on the plating process base material. The uniform layer of material can be bonded to the plating process base material of the microstructure and retain the fine features of the microstructure.

The plating of the microstructure can be performed at a relatively low temperature. With the relatively low temperature of plating the microstructure the generation of the microstructure and connected circuitry can stay within a predetermined temperature budget.

With the relatively low temperature of the plating process a number of the steps discussed within FIG. 1 and FIG. 2 that have a relatively high temperature budget can be performed prior to coupling/connecting the microstructure to devices that have a constrained thermal budget. For example, if the microstructure plating base material is polycrystalline silicon, a 1050° Celsius (C) stress-relaxation anneal can be performed. In this example, the stress-relaxation anneal can be critical to a successful beam formation that enables mechanical success after release. In another example, microstructures built on top of existing devices such as a complementary metal-oxide-semiconductor (CMOS) device and/or integrate the beam to interconnect metals can exceed the thermal budget of the CMOS device and/or interconnect metals. Exceeding the thermal budget can damage the CMOS device and/or interconnect metals and the device may not operate correctly (e.g., operate to industry standard, operate to specifications, etc.).

Figure 3:
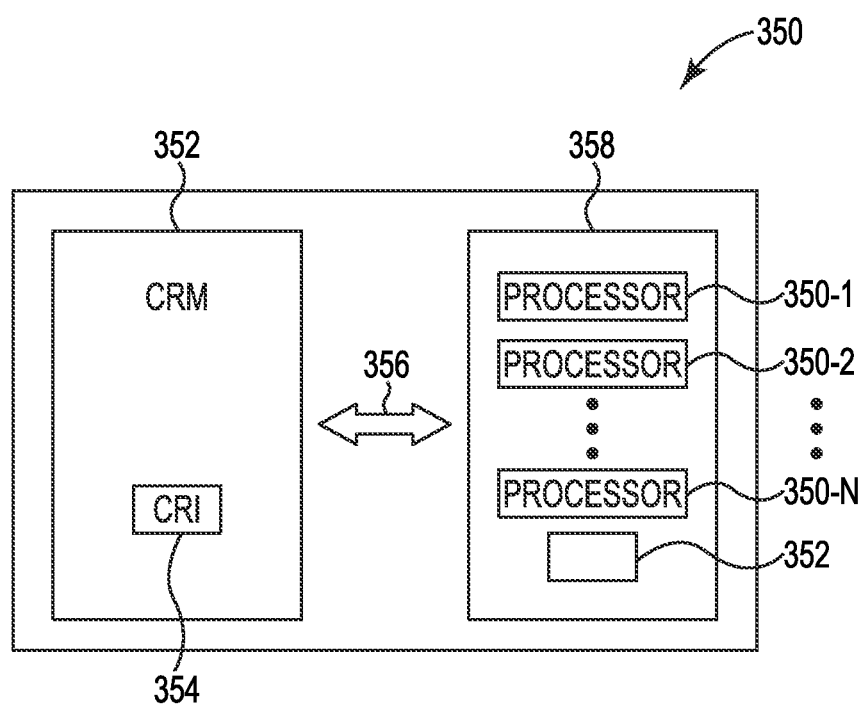
FIG. 3 illustrates a block diagram of an example of a computing device in accordance with one or more embodiments of the present disclosure.

FIG. 3 illustrates a block diagram of an example of a computing device 350 in accordance with one or more embodiments of the present disclosure. The computing device 350 can be a portable computing device (e.g., hand held computing device, laptop, etc.). The computing device 350 can include a communication interface (e.g., wireless network interface controller, IEEE 802.11 adapters, etc.) for receiving wireless data from a number of wireless nodes. The communication interface can be integrated in the computing device 350 and/or be an external card.

The computing device 350, as described herein, can also include a computer readable medium (CRM) 352 in communication with processing resources 350-1, 350-2, . . . , 350-N. CRM 352 can be in communication with a device 358 (e.g., a Java® application server, among others) having processor resources 350-1, 350-2, . . . , 350-N. The device 358 can be in communication with a tangible non-transitory CRM 352 storing a set of computer-readable instructions (CRI) 354 (e.g., modules) executable by one or more of the processor resources 350-1, 350-2, . . . , 350-N, as described herein. The CRI 354 can also be stored in remote memory managed by a server and represent an installation package that can be downloaded, installed, and executed. The device 358 can include memory resources 352, and the processor resources 350-1, 350-2, . . . , 350-N can be coupled to the memory resources 352.

Processor resources 350-1, 350-2, . . . , 350-N can execute CRI 354 that can be stored on an internal or external non-transitory CRM 352. The processor resources 350-1, 350-2, . . . , 350-N can execute CRI 354 to perform various functions. For example, the processor resources 350-1, 350-2, . . . , 350-N can execute CRI 354 to perform a number of functions (e.g., depositing a number of plating process base materials, etc.). A non-transitory CRM (e.g., CRM 352), as used herein, can include volatile and/or non-volatile memory. Volatile memory can include memory that depends upon power to store information, such as various types of dynamic random access memory (DRAM), among others. Non-volatile memory can include memory that does not depend upon power to store information. Examples of non-volatile memory can include solid state media such as flash memory, electrically erasable programmable read-only memory (EEPROM), phase change random access memory (PCRAM), magnetic memory such as a hard disk, tape drives, floppy disk, and/or tape memory, optical discs, digital versatile discs (DVD), Blu-ray discs (BD), compact discs (CD), and/or a solid state drive (SSD), as well as other types of computer-readable media.

The non-transitory CRM 352 can also include distributed storage media. For example, the CRM 352 can be distributed among various locations.

The non-transitory CRM 352 can be integral, or communicatively coupled, to a computing device, in a wired and/or a wireless manner. For example, the non-transitory CRM 352 can be an internal memory, a portable memory, a portable disk, or a memory associated with another computing resource (e.g., enabling CRTs to be transferred and/or executed across a network such as the Internet).

The CRM 352 can be in communication with the processor resources 350-1, 350-2, . . . , 350-N via a communication path 356. The communication path 356 can be local or remote to a machine (e.g., a computer) associated with the processor resources 350-1, 350-2, . . . , 350-N. Examples of a local communication path 356 can include an electronic bus internal to a machine (e.g., a computer) where the CRM 352 is one of volatile, non-volatile, fixed, and/or removable storage medium in communication with the processor resources 350-1, 350-2, . . . , 350-N via the electronic bus. Examples of such electronic buses can include Industry Standard Architecture (ISA), Peripheral Component Interconnect (PCI), Advanced Technology Attachment (ATA), Small Computer System Interface (SCSI), Universal Serial Bus (USB), among other types of electronic buses and variants thereof.

The communication path 356 can be such that the CRM 352 is remote from the processor resources e.g., 350-1, 350-2, . . . , 350-N, such as in a network relationship between the CRM 352 and the processor resources (e.g., 350-1, 350-2, . . . , 350-N). That is, the communication path 356 can be a network relationship. Examples of such a network relationship can include a local area network (LAN), wide area network (WAN), personal area network (PAN), and the Internet, among others. In such examples, the CRM 352 can be associated with a first computing device and the processor resources 350-1, 350-2, . . . , 350-N can be associated with a second computing device (e.g., a Java® server).

As described herein, a "module" can include computer readable instructions (e.g., CRI 354) that can be executed by a processor to perform a particular function. A module can also include hardware, firmware, and/or logic that can perform a particular function.

As used herein, "logic" is an alternative or additional processing resource to execute the actions and/or functions, described herein, which includes hardware (e.g., various forms of transistor logic, application specific integrated circuits (ASICs)), as opposed to computer executable instructions (e.g., software, firmware) stored in memory and executable by a processor.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method for microstructure plating, comprising:
   depositing a plating-resistant material between a microstructure and a bonding layer, wherein the microstructure comprises a plating process base material;
   releasing the microstructure via a chemical etch, wherein the plating-resistant material acts as an etch stop; and
   immersing the microstructure in a plating solution.

2. The method of claim 1, wherein depositing the plating-resistant material includes depositing silicon nitride between the microstructure and the bonding layer.

3. The method of claim 2, wherein depositing the silicon nitride includes creating an etch stop position for the microstructure.

4. The method of claim 1, wherein immersing the microstructure in a plating solution includes preventing the bonding layer from plating solution immersion.

5. The method of claim 1, wherein immersing the microstructure in a plating solution includes utilizing an isotropic gold plating solution.

6. The method of claim 1, wherein the microstructure is a sensor coupled to a number of bonding elements within the bonding layer.

7. A method for microstructure plating, comprising:
   bonding circuitry to a bonding layer that is coupled to a microstructural sensor via wafer or die bonding, wherein the bonding layer and microstructural sensor are separated by a plating-resistant material;
   releasing the microstructural sensor via a chemical etch, wherein the plating-resistant material acts as an etch stop; and
   immersing the microstructural sensor in a plating solution, wherein the plating-resistant material acts as a plating stop.

8. The method of claim 7, wherein releasing the microstructural sensor includes immersing the microstructural sensor and surrounding silicon within a hydrofluoric acid chemical etch to release the microstructural sensor from the surrounding silicon.

9. The method of claim 7, comprising maintaining a predetermined thermal budget by separating a number of steps to account for an individual thermal budget of materials utilized in each of the number of steps.

10. The method of claim 9, wherein the thermal budget is related to protecting features of the circuitry.

11. The method of claim 7, comprising depositing silicon nitride between the bonding layer and the microstructural sensor.

* * * * *